(12) United States Patent
Schmit et al.

(10) Patent No.: US 9,813,061 B1
(45) Date of Patent: *Nov. 7, 2017

(54) CIRCUITRY FOR IMPLEMENTING MULTI-MODE REDUNDANCY AND ARITHMETIC FUNCTIONS

(71) Applicant: Altera Corporation, San Jose, CA (US)

(72) Inventors: Herman Henry Schmit, Palo Alto, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/150,869

(22) Filed: May 10, 2016

Related U.S. Application Data

(63) Continuation of application No. 14/499,006, filed on Sep. 26, 2014, now Pat. No. 9,362,913.

(51) Int. Cl.
| | |
|---|---|
| *H03K 19/003* | (2006.01) |
| *G06F 7/501* | (2006.01) |
| *H03K 19/23* | (2006.01) |
| *H03K 19/007* | (2006.01) |
| *G06F 11/20* | (2006.01) |

(52) U.S. Cl.
CPC ....... *H03K 19/00392* (2013.01); *G06F 7/501* (2013.01); *G06F 11/2089* (2013.01); *G06F 11/2094* (2013.01); *H03K 19/0075* (2013.01); *H03K 19/00369* (2013.01); *H03K 19/23* (2013.01)

(58) Field of Classification Search
CPC .... G06F 11/184; G06F 11/106; G06F 11/079; G06F 11/187; G06F 11/2215; G06F 7/501; G11C 29/4401; G11C 29/808; H03K 19/00392; H03K 19/0033; H03K 19/17764; H03K 19/00338; H03K 19/17748; H03K 19/17736; H03K 19/0075; H03K 19/23
See application file for complete search history.

(56) References Cited

U.S. PATENT DOCUMENTS

| | | | |
|---|---|---|---|
| 4,967,347 A | 10/1990 | Smith et al. | |
| 5,677,860 A * | 10/1997 | Yazawa | G06F 7/509 708/530 |
| 5,818,743 A | 10/1998 | Lee et al. | |
| 6,393,599 B1 * | 5/2002 | Chan | H04L 27/233 714/797 |
| 6,526,559 B2 | 2/2003 | Schiefele et al. | |

(Continued)

*Primary Examiner* — Vibol Tan
(74) *Attorney, Agent, or Firm* — Jason Tsai

(57) ABSTRACT

Integrated circuits such as application specific integrated circuits or programmable logic devices may include multiple copies of a same circuit together with a majority vote circuit in a configuration that is sometimes also referred to as multi-mode redundancy. An adder circuit may be coupled to these multiple copies and produce a carry-out signal and a sum signal based on signals received from the multiple copies. The carry-out signal of the adder circuit may provide the result of the majority vote operation. A logic exclusive OR gate may perform a logic exclusive OR operation between the sum signal and the carry-out signal, thereby generating an error signal. The error signal may indicate that one of the multiple copies produces an output that is different than the outputs produced by the other copies.

20 Claims, 7 Drawing Sheets

(56) References Cited

U.S. PATENT DOCUMENTS

| | | |
|---|---|---|
| 6,715,066 B1 | 3/2004 | Steele, Jr. |
| 6,910,173 B2 | 6/2005 | Mitra et al. |
| 7,036,059 B1 | 4/2006 | Carmichael et al. |
| 7,200,822 B1 | 4/2007 | McElvain |
| 7,310,759 B1 | 12/2007 | Carmichael et al. |
| 7,373,368 B1 | 5/2008 | Rarick et al. |
| 7,512,871 B1 | 3/2009 | Carmichael et al. |
| 7,620,883 B1 | 11/2009 | Carmichael et al. |
| 7,772,874 B2 | 8/2010 | Rezgui et al. |
| 8,191,021 B2 | 5/2012 | Rezgui |
| 8,352,532 B1 | 1/2013 | Kostarnov et al. |
| 8,447,798 B2 * | 5/2013 | Langhammer ........ G06F 7/5057 708/235 |
| 8,589,737 B2 | 11/2013 | Rohleder et al. |
| 8,707,094 B2 | 4/2014 | Hickey et al. |
| 9,362,913 B1 * | 6/2016 | Schmit ............. H03K 19/00392 |
| 2014/0164839 A1 * | 6/2014 | Toba ................ H03K 19/17756 714/37 |

* cited by examiner

CIRCUITRY FOR IMPLEMENTING MULTI-MODE REDUNDANCY AND ARITHMETIC FUNCTIONS

This application is a continuation of U.S. patent application Ser. No. 14/499,006, filed Sep. 26, 2014, which is hereby incorporated by reference herein in its entirety. This application claims the benefit of and claims priority to U.S. patent application Ser. No. 14/499,006, filed Sep. 26, 2014.

BACKGROUND

This invention relates to integrated circuits and, more particularly, to circuitry that implements multi-mode redundancy and arithmetic functions in integrated circuits.

Integrated circuits are subject to a phenomenon known as single event upset (SEU). A single event upset is a change of state caused by ions or electro-magnetic radiation. Cosmic rays or radioactive impurities embedded in integrated circuits and their packages may be responsible for generating such ions or electro-magnetic radiation. When ions or electro-magnetic radiation strike the silicon substrate on which the integrated circuit is implemented, the state of a node may change. For example, a single event upset may cause a logic "1" to change to a logic "0".

Upset events in sequential elements (e.g., memory elements, latches, or registers) can have serious repercussions. Users who are concerned with detecting and correcting errors in a design or a portion of a design that is implemented in an integrated circuit often create multiple copies of that design or that portion of the design. A majority vote of the outputs produced by the different design copies may enable the detection of an upset event and indicate the location of the corrupted design copy. The technique of using multiple copies of a same design together with a majority vote is sometimes also referred to as multi-mode redundancy.

However, multi-mode redundancy requires multiple times the circuit area of a single design implementation plus the cost and delay associated with resources required for the implementation of the majority voting circuitry.

It would therefore be desirable to reduce the cost and delay associated with implementing multi-mode redundancy on an integrated circuit.

SUMMARY

In accordance with certain aspects of the invention, an integrated circuit such as a programmable integrated circuit may have first and second circuits. The second circuit may receive at least three signals from the first circuit, compute a sum of the at least three signals in an arithmetic mode, and produce a majority signal based on a majority vote function of the at least three signals in an error detect and correct mode.

The first circuit may include a plurality of sub-circuits. At least first and second sub-circuits may be duplicates of a third sub-circuit in the plurality of sub-circuits, and share at least one input.

It is appreciated that the present invention can be implemented in numerous ways, such as a process, an apparatus, a system, a device, or instructions executed on a programmable processor. Several inventive embodiments are described below.

In certain embodiments, the above-mentioned second circuit may further include an adder. The adder may receive first, second, and third signals of the at least three signals from the first circuit and compute a sum signal and a carry signal based on the received signals. In this embodiment, the computed carry signal may implement the majority vote function. A logic exclusive OR gate coupled to the adder may receive the carry signal and the sum signal and produce an error signal, wherein the error signal indicates the absence of an error when the at least three signals are identical.

If desired, the above-mentioned second circuit may further include an additional adder that is coupled between the first circuit and the adder. The additional adder may receive fourth and fifth signals of the at least three signals, while the adder receives the first signal from the additional adder and receives the second and third signals from the first circuit.

Further features of the invention, its nature and various advantages, will be more apparent from the accompanying drawings and the following detailed description of the preferred embodiments.

DETAILED DESCRIPTION

The present invention relates to integrated circuits such as programmable integrated circuits and more particularly to circuitry that implements multi-mode redundancy and arithmetic functions in integrated circuits.

As previously described, some users may create multiple copies of a same design and implement the multiple design copies in an integrated circuit together with a majority vote circuit. The combination of using multiple copies of the same design together with a majority vote circuit is sometimes also referred to as multi-mode redundancy.

However, multi-mode redundancy requires multiple times the circuit area of a single design implementation plus the cost and delay associated with resources required for the implementation of the majority voting circuitry.

It would therefore be desirable to provide a multi-mode redundancy implementation on an integrated circuit at a reduced cost. For example, portions of the majority voting circuit may be combined with existing arithmetic circuitry on the integrated circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
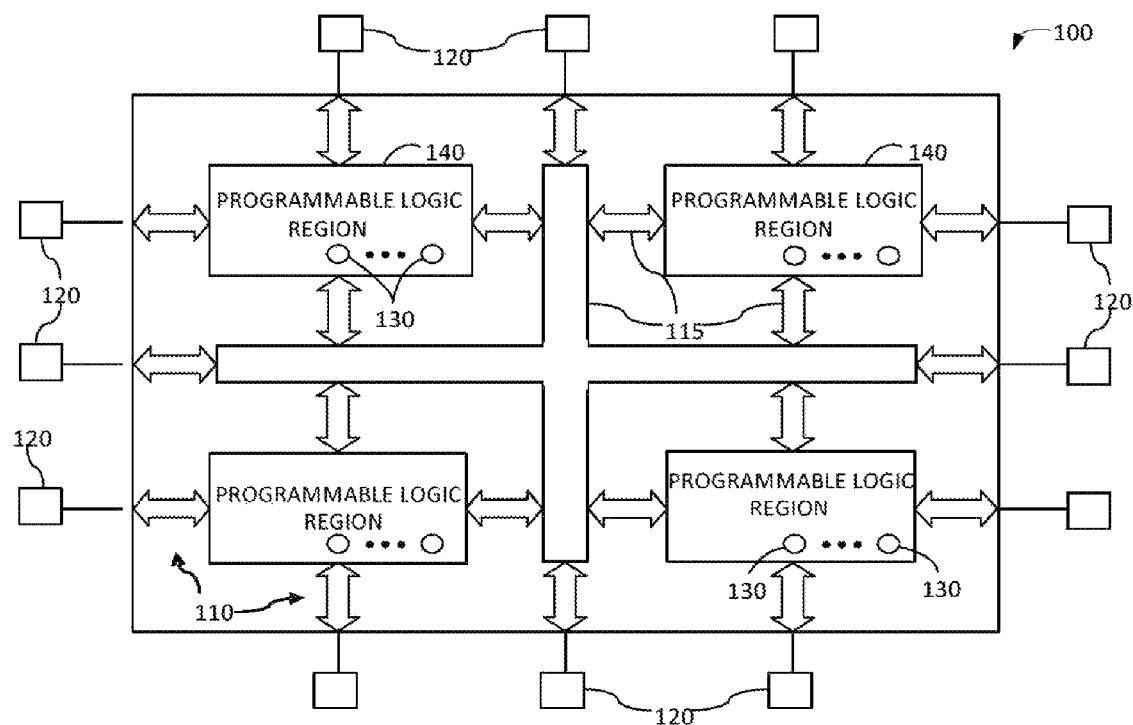
FIG. 1 is a diagram of an illustrative programmable integrated circuit with programmable logic regions in accordance with an embodiment.

An illustrative embodiment of an integrated circuit such as a programmable logic device 100 in accordance with the present invention is shown in FIG. 1.

Programmable logic device 100 has input-output (I/O) circuitry 110 for driving signals off of device 100 and for receiving signals from other devices via input-output (I/O) pins 120. Interconnection resources 115 such as global and local vertical and horizontal conductive lines and buses may be used to route signals on device 100.

Input-output (I/O) circuitry 110 include conventional input-output (I/O) circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry such as adders arranged in carry chains, or other combinational and sequential logic circuitry such as configurable register circuitry. As an example, the configurable register circuitry may operate as a conventional register. Alternatively, the configurable register circuitry may operate as a random-access memory.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

Programmable logic device 100 contains programmable memory elements 130. Memory elements 130 can be loaded with configuration data (also called programming data) using pins 120 and input-output (I/O) circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM, or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing for example multiple logic elements or multiple ALMs.

During device programming, configuration data is loaded into device 100 that configures the programmable logic regions 140 so that their logic resources perform desired logic functions. For example, the configuration data may configure a portion of the configurable register circuitry to operate as a conventional register. If desired, the configuration data may configure some of the configurable register circuitry to operate as a register with error detection and error correction capabilities.

Figure 2:
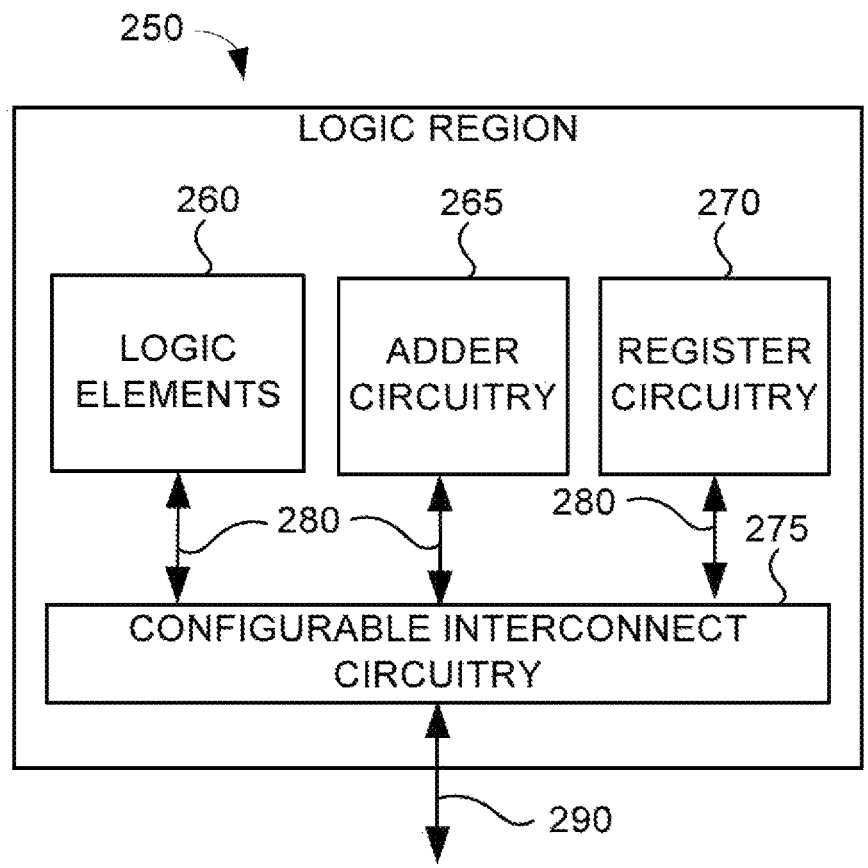
FIG. 2 is a diagram of an illustrative logic region in accordance with an embodiment.

FIG. 2 shows an illustrative diagram of a logic region 250. As shown in FIG. 2, logic region 250 may include logic elements 260, adder circuitry 265, register circuitry 270, and configurable interconnect circuitry 275. Logic elements 260 may include one or more configurable look-up tables. For example, logic elements may include four three-input look-up tables which may be configured to implement two independent four-input look-up tables, one five-input look-up table, or two five-input look-up tables which share at least two inputs, etc.

Adder circuitry 265 may include one or more adders. Each of these adders may implement a half-adder, a full-adder, a carry-save adder, a carry-select adder, a ripple-carry adder, a carry-lookahead adder, or any other suitable adder circuitry.

Register circuitry 270 may include registers, latches, time-borrowing flip-flops (TBFF), or any other synchronous circuitry that is controlled by a clock signal. If desired, register circuitry 270 may contain several different synchronous elements such as registers and latches, or registers and time-borrowing flip-flops, just to name a few combinations.

Internal interconnection resources 280 such as conductive lines and busses may be used to send data from one component to another component or to broadcast data from one component to one or more other components. External interconnection resources 290 such as conductive lines and busses may be used to communicate with external components. External interconnection resources 290 may convey data signals between logic region 250 and external components. If desired, external interconnection resources may also convey control signals such as clock signals, asynchronous reset signals, etc.

Configurable interconnect circuitry 275 couples logic elements 260, adder circuitry 265, and register circuitry 270 with each other through internal interconnection resources 280 and to external components through external interconnection resources 290. Configurable interconnect circuitry 275 may include memory elements (e.g., memory elements 130 of FIG. 1) which may be loaded with configuration data during device programming.

A single event upset (SEU) that causes a change of state in a programmable logic device such as programmable logic device 100 of FIG. 1 may not only modify the current signals stored in the programmable logic device, but also modify the behavior of the device (e.g., by flipping a bit of configuration data such as the configuration data stored in memory elements 130 of FIG. 1).

As an example, consider that a look-up table (e.g., a look-up table in logic element 260 of FIG. 2) implements a two-input logic NAND gate and that a single event upset (SEU) causes the memory element associated with inputs "00" to switch states from logic "1" to logic "0". As a result, the look-up table may implement a two-input logic exclusive OR gate instead of the two-input logic NAND gate.

Figure 3:
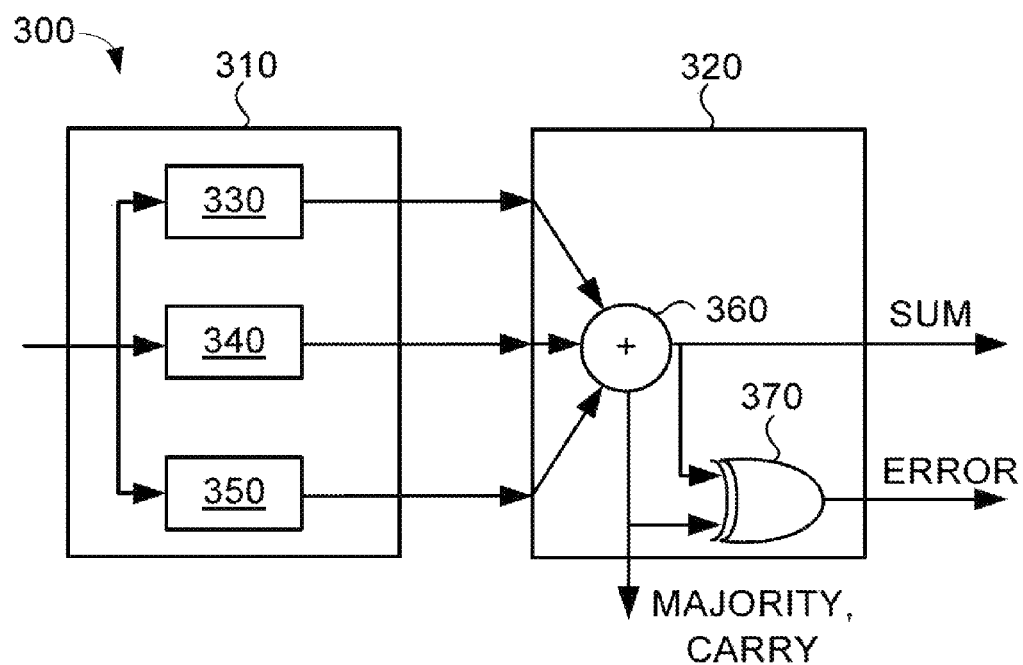
FIG. 3 is a diagram of illustrative first and second circuits that implement triple-mode redundancy in accordance with an embodiment.

Multi-mode redundancy in which a combination of multiple copies of the same design is used together with a majority vote circuit may provide protection from single event upsets. FIG. 3 shows a diagram of illustrative first and second circuits that implement triple-mode redundancy in accordance with an embodiment.

Circuit 310 may include three identical copies of a circuit (e.g., circuits 330, 340, and 350). All three circuits may receive the same signals at the same inputs and produce independently of each other an output signal. The three output signals may be sent from circuit 310 to circuit 320.

Circuit 320 may implement a majority function and an error function in a first mode. In a second mode, circuit 320 may implement an addition of the three input signals. As an example, circuit 320 may include adder circuit 360 and logic exclusive OR gate 370. Adder circuit 360 may receive the three output signals from circuits 330, 340, and 350 and compute a sum and a carry of the three signals. As shown in TABLE 1 below, the carry of the three signals may also implement a majority signal produced by a majority function, which is logic "1" when the majority of the three signals is logic "1". The majority function is sometimes also referred to as median operator.

Similarly, an error may be detected when at least one circuit of circuits 330, 340, and 350 produces a different output signal than the other two circuits. In other words, an error may be detected when not all circuits 330, 340, and 350 produce the same results. As shown in TABLE 1, performing a logic exclusive OR operation on the sum and the majority or carry (e.g., using logic exclusive OR gate 370) may produce such an error signal.

TABLE 1

| 330 | 340 | 350 | SUM | CARRY | MAJORITY | ERROR |
|---|---|---|---|---|---|---|
| 0 | 0 | 0 | 0 | 0 | 0 | 0 |
| 0 | 0 | 1 | 1 | 0 | 0 | 1 |
| 0 | 1 | 0 | 1 | 0 | 0 | 1 |
| 0 | 1 | 1 | 0 | 1 | 1 | 1 |
| 1 | 0 | 0 | 1 | 0 | 0 | 1 |
| 1 | 0 | 1 | 0 | 1 | 1 | 1 |
| 1 | 1 | 0 | 0 | 1 | 1 | 1 |
| 1 | 1 | 1 | 1 | 1 | 1 | 0 |

Figure 4:
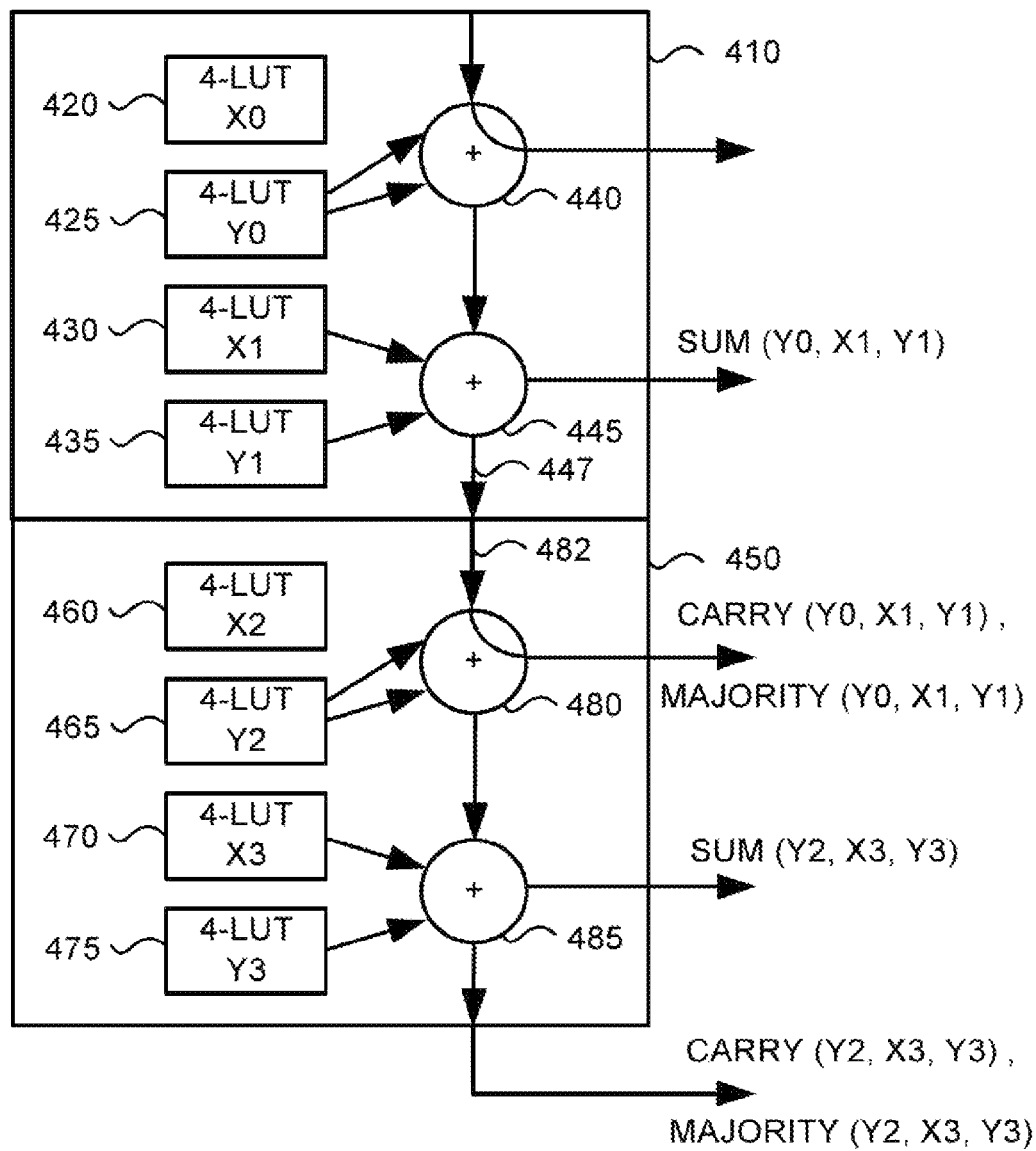
FIG. 4 is a diagram of illustrative logic regions coupled by a carry chain, which is configurable as two independent three-input adder circuits or as two triple-mode redundancy circuits in accordance with an embodiment.

As mentioned above, logic region 250 of FIG. 2 may be configured in various different ways. For example, circuits 330, 340, and 350 may be implemented in one or more logic regions 250 or in a portion of logic region 250. An embodiment of a configuration of two logic regions is shown in FIG. 4. As shown, illustrative logic regions 410 and 450 may be coupled by a carry chain in which the outgoing carry connection 447 of logic region 410 may be coupled to the incoming carry connection 482 of logic region 410. The two logic regions may be configured as two independent three-input adder circuits or as two triple-mode redundancy circuits in accordance with an embodiment.

As shown, logic region 410 may include four-input look-up tables 420, 425, 430, and 435 and adders 440 and 445, and logic region 450 may include four-input look-up tables 460, 465, 470, and 475 and adders 480 and 485.

If desired, some or all of look-up tables 420, 425, 430, and 435 in logic region 410 may have any number of inputs. For example, look-up tables 420, 425, 430, and 435 may all have less than four inputs (e.g., two inputs or three inputs) or more than four inputs (e.g., five, six, seven, eight, inputs, etc.). As another example, look-up tables 420 and 425 may have three inputs, look-up table 430 may have six inputs, and look-up table 435 may have two inputs.

As shown, adders 440, 445, 480, and 485 may be single-bit adders with three inputs, a sum output, and a carry output. In other words, adders 440, 445, 480, and 485 may receive one bit at a time at each of their three inputs. Adders 440, 445, 480, and 485 may produce a '1' at the sum output if an odd number of inputs are '1'. Adders 440, 445, 480, and 485 may produce a '1' at the carry output if two or more inputs are '1'. Adders 440, 445, 480, and 485 may be coupled in a carry chain in which adders 445, 480, and 485 receive a carry signal or a majority vote signal directly from adders 440, 445, and 480, respectively.

For example, adders 440 and 445 in logic region 410 may be configured as a three-input adder circuit. In this configuration, adder 440 may receive signal Y0 from look-up table 425 at both inputs and compute the carry signal for those two inputs, thereby essentially routing signal Y0 from look-up table 425 through the carry chain to adder 445 and thus preferably using a fast path through the existing carry chain. Alternatively, additional routing circuitry may be used to route signal Y0 from look-up table 425 to adder 445.

Adder 445 may receive signal X1 from look-up table 430, signal Y1 from look-up table 435, and signal Y0 through the carry chain from adder 440. Adder 445 may compute the sum of signals Y0, X1, and Y1 and provide the result at an output of logic region 410. If desired, adder 445 may compute the carry signal resulting from the addition of Y0, X1, and Y1 and send the carry signal to adder 480 from which the carry signal may be routed from the sum output of adder 480 to an output of logic region 450. Adder 480 may receive signal Y2 from look-up table 465 at both inputs and compute the carry signal for those two inputs, thereby essentially routing signal Y2 from look-up table 465 through the carry chain to adder 485 and thus preferably using a fast path through the existing carry chain. Alternatively, additional routing circuitry may be used to route signal Y2 from look-up table 465 to adder 485.

Adder 485 may receive signal X3 from look-up table 470, signal Y3 from look-up table 475, and signal Y2 through the carry chain from adder 480. Adder 485 may compute the sum of signals Y2, X3, and Y3 and provide the result at an output of logic region 450. If desired, adder 485 may compute the carry signal resulting from the addition of Y2, X3, and Y3 and send the carry signal to another adder in a logic region below logic region 450 (not shown) from which the carry signal may be routed to an output of the logic region below logic region 450.

In another example, adders 440 and 445 in logic region 410 and adders 480 and 485 in logic region 450 may be configured as two independent majority voting circuits in two triple-mode redundancy configurations. In this configuration, look-up tables 425, 430, and 435 may implement the same function and receive the same inputs, and look-up tables 465, 470, and 475 may implement the same function and receive the same inputs.

Adder 440 may receive signal Y0 from look-up table 425 at both inputs and compute the majority signal for those two inputs, thereby essentially routing signal Y0 from look-up table 425 through the carry chain to adder 445. Adder 445 may receive signal X1 from look-up table 430, signal Y1 from look-up table 435, and signal Y0 through the carry chain from adder 440. Adder 445 may compute the majority signal of Y0, X1, and Y1 and send the majority signal to adder 480 from which the majority signal may be routed to an output of logic region 450.

Adder 480 may receive signal Y2 from look-up table 465 at both inputs and compute the majority signal for those two inputs, thereby essentially routing signal Y2 from look-up table 465 through the carry chain to adder 485. Adder 485 may receive signal X3 from look-up table 470, signal Y3 from look-up table 475, and signal Y2 through the carry chain from adder 480. Adder 485 may compute the majority signal of Y2, X3, and Y3 and send the majority signal to another adder in a logic region below logic region 450 (not shown) from which the majority signal may be routed to an output of the logic region below logic region 450.

As shown in FIG. 4, look-up tables 420 and 460 of logic regions 410 and 450, respectively, may implement portions of a user design that are unrelated to the triple-mode redundancy or the adder circuitry. If desired, look-up table 420 may be configured as a duplicate of look-up table 425 and a majority signal may be computed based on all look-up tables in logic region 410 and thus implement a quad-mode redundancy.

Figure 5:
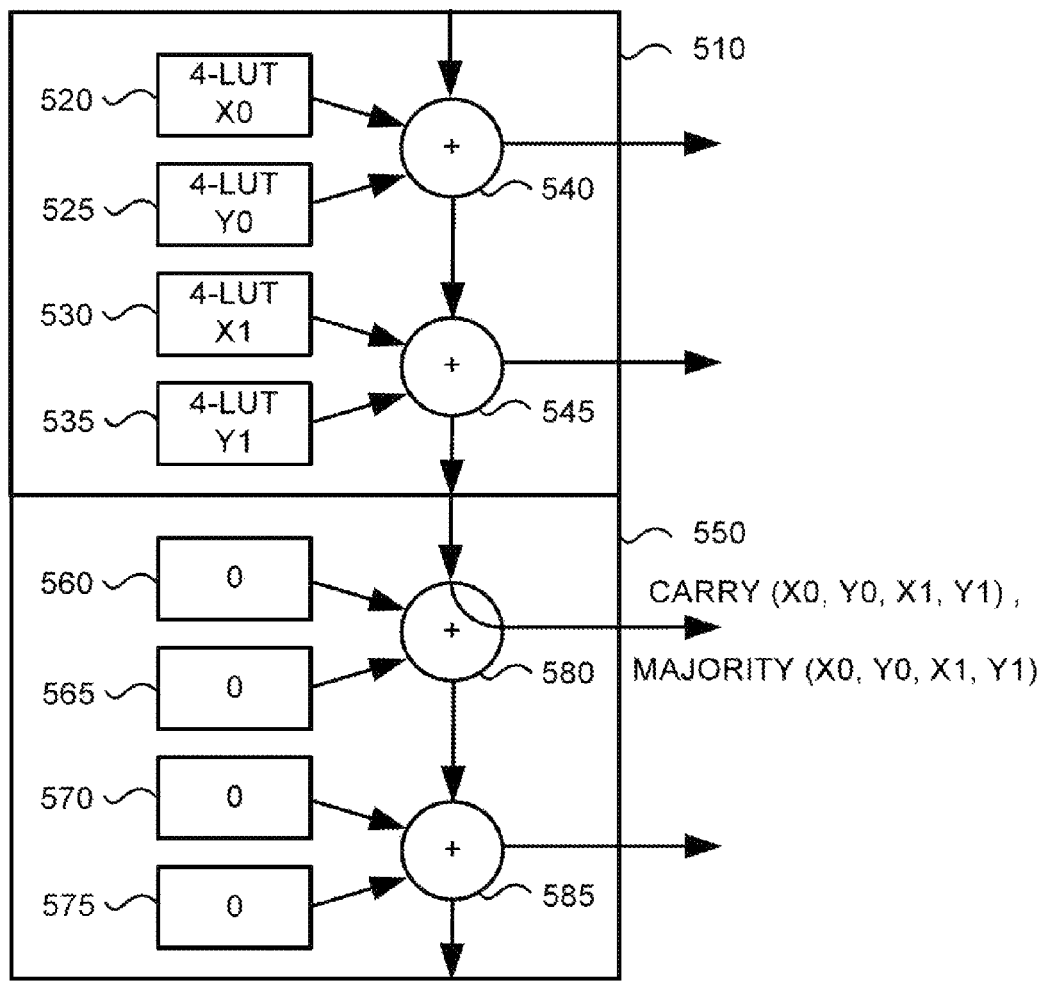
FIG. 5 is a diagram of illustrative logic regions coupled by a carry chain, which is configurable as a four-input adder circuit or as a quad-mode redundancy circuit in accordance with an embodiment.

FIG. 5 shows logic regions 510 and 550 that are coupled by a carry chain. As shown, logic region 510 may be configured as a four-input adder circuit or as a quad-mode redundancy circuit in accordance with an embodiment. In quad-mode redundancy, a majority may not be definite when half the signals are logic "1" and the other half is logic "0", which is shown in TABLE 2.

TABLE 2

| X0 | Y0 | X1 | Y1 | SUM | CARRY | MAJORITY |
|----|----|----|----|-----|-------|----------|
| 0  | 0  | 0  | 0  | 0   | 0     | 0        |
| 0  | 0  | 0  | 1  | 1   | 0     | 0        |
| 0  | 0  | 1  | 0  | 2   | 0     | 0        |
| 0  | 0  | 1  | 1  | 3   | 0     | N/A      |
| 0  | 1  | 0  | 0  | 1   | 0     | 0        |
| 0  | 1  | 0  | 1  | 2   | 0     | N/A      |
| 0  | 1  | 1  | 0  | 3   | 0     | N/A      |
| 0  | 1  | 1  | 1  | 4   | 1     | 1        |
| 1  | 0  | 0  | 0  | 2   | 0     | 0        |
| 1  | 0  | 0  | 1  | 3   | 0     | N/A      |
| 1  | 0  | 1  | 0  | 4   | 1     | N/A      |
| 1  | 0  | 1  | 1  | 5   | 1     | 1        |
| 1  | 1  | 0  | 0  | 3   | 0     | N/A      |
| 1  | 1  | 0  | 1  | 4   | 1     | 1        |
| 1  | 1  | 1  | 0  | 5   | 1     | 1        |
| 1  | 1  | 1  | 1  | 6   | 1     | 1        |

As shown in TABLE 2, the majority signal may be equal to the carry signal whenever the majority signal is definite.

As shown, logic region 510 may include four-input look-up tables 520, 525, 530, and 535 and adders 540 and 545, and logic region 550 may include four-input look-up tables 560, 565, 570, and 575 and adders 580 and 585. Adders 540, 545, 580, and 585 may be coupled in a carry chain in which adders 545 and 580 receive a carry signal or a majority vote signal from adders 540 and 545, respectively.

For example, adders 540 and 545 in logic region 510 may be configured as a four-input adder circuit. A four-input adder adds two two-bit numbers (e.g., "X1 X0" and "Y1 Y0") together and the result may be represented as a three-bit number. In this configuration, adder 540 may receive the two least significant bits X0 and Y0 of the two two-bit numbers from look-up tables 520 and 525, respectively, and compute the sum and the carry signal for those two inputs. The sum of X0 and Y0 may be provided at an output of logic region 510.

Adder 545 may receive the two most significant bits X1 and Y1 of the two two-bit numbers from look-up tables 530 and 535, and the carry signal of the addition of X0 and Y0 through the carry chain from adder 540. Adder 545 may compute the sum of signals X0, Y0, X1, and Y1 and provide the result at an output of logic region 510. If desired, adder 545 may compute the carry signal resulting from the addition of X0, Y0, X1, and Y1 and send the carry signal to adder 580 from which the carry signal may be routed to an output of logic region 550.

In another example, adders 540 and 545 in logic region 510 may be configured as majority voting circuits in quad-mode redundancy. In this configuration, look-up tables 520, 525, 530, and 535 may implement the same function and receive the same inputs.

Adder 540 may receive signals X0 and Y0 from look-up tables 520 and 525, respectively, and compute the carry signal for those two signals. Adder 545 may receive signal X1 from look-up table 530, signal Y1 from look-up table 535, and the carry signal of X0 and Y0 through the carry chain from adder 540. Adder 545 may compute the majority signal of X0, Y0, X1, and Y1 and send the majority signal to adder 580 from which the majority signal may be routed to an output of logic region 550.

The majority signal in this example and the carry signal from the previous example may use the same underlying circuitry, which may result in numerically identical numbers for the same inputs. Thus, the majority signal in this example inherently performs tie-breaking whenever the majority is indefinite as shown in TABLE 2.

If desired, logic region 550 may be configured to operate as a three-input adder, in triple-mode redundancy mode, or in any other mode that doesn't use the sum output of adder 580. For example, four-input look-up tables 560, 565, 570, or 575 may implement any function of four inputs, and the outputs of look-up tables 570 and 575 may be added in adder 585.

In the event that logic region 510 provides a path to route the carry signal of adder 545 to an output of logic region 510 without using adder 580 in logic region 550, both logic regions (i.e., logic regions 510 and 550) may be configured two independent four-input adder circuits or as two quad-mode redundancy circuits.

Figure 6:
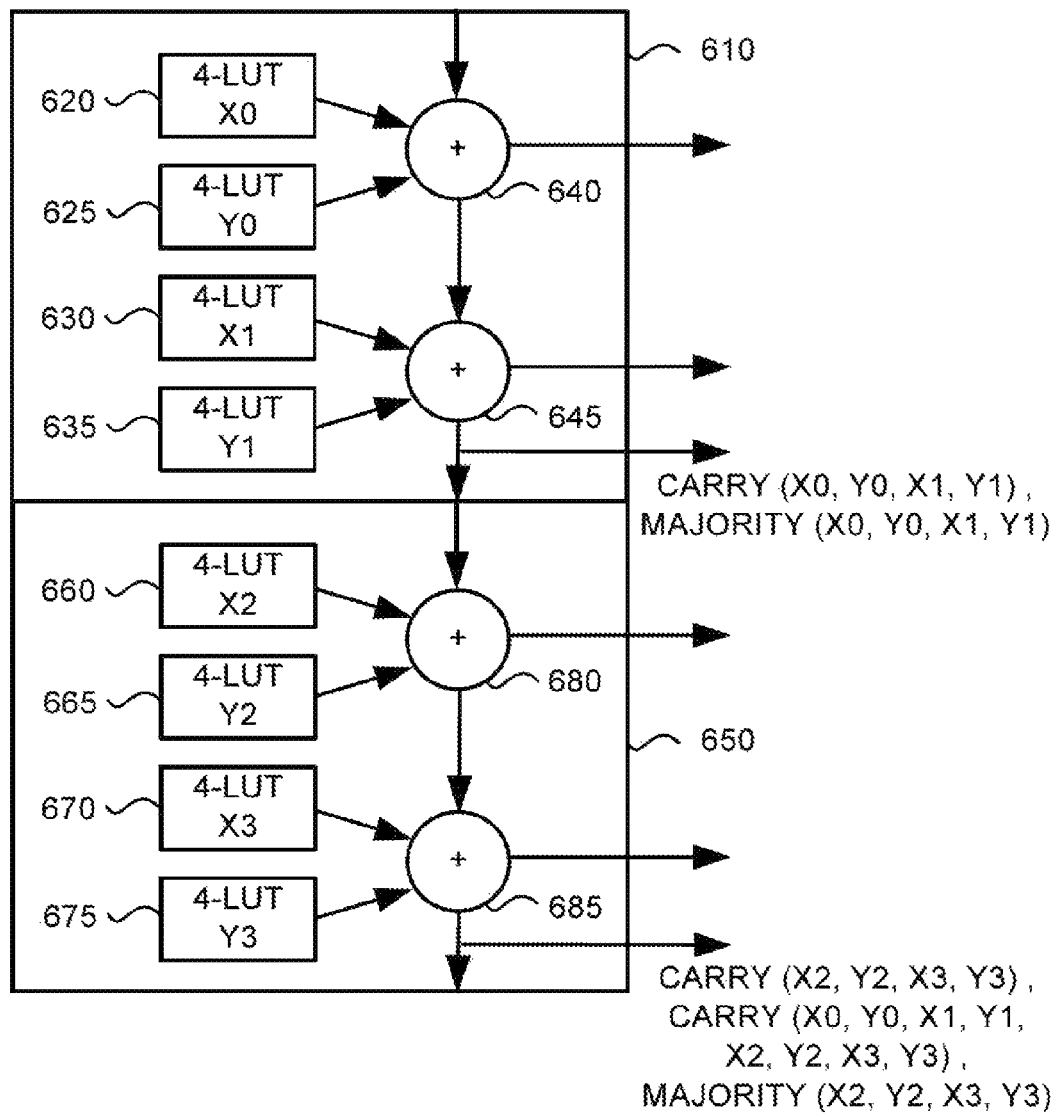
FIG. 6 is a diagram of illustrative logic regions coupled by a carry chain, which is configurable as two independent four-input adder circuits, an eight-input adder circuit, or as two quad-mode redundancy circuits in accordance with an embodiment.

FIG. 6 is a diagram of such logic regions, which may be configured as two independent adder circuits, one adder circuit, or as two quad-mode redundancy circuits in accordance with an embodiment.

As shown, logic region 610 may include four-input look-up tables 620, 625, 630, and 635 and adders 640 and 645, and logic region 650 may include four-input look-up tables 660, 665, 670, and 675 and adders 680 and 685. Adders 640, 645, 680, and 685 may be coupled in a carry chain in which adders 645, 680, and 685 receive a carry signal or a majority vote signal from adders 640, 645, and 680, respectively.

For example, consider that logic regions 610 and 650 are configured to implement two independent adders. In this example, the carry chain between adders 645 and 680 may be broken up. In other words, the carry input into logic region 650 may be set to '0'. For example, the carry input of logic region 650 may be coupled to select circuitry, which may select between the carry signal received over the carry chain from logic region 610 (i.e., the carry signal out of adder 645) and a reset signal that sets the carry input signal into adder 680 to '0'.

Adders 640 and 645 may add two two-bit numbers (e.g., "X1 X0" and "Y1 Y0") together and the result may be represented as a three-bit number. In this configuration, adder 640 may receive the two least significant bits X0 and Y0 of the two two-bit numbers from look-up tables 620 and 625, respectively, and compute the sum and the carry signal for those two input signals. The sum of X0 and Y0 may be provided at an output of logic region 610.

Adder 645 may receive the two most significant bits X1 and Y1 of the two two-bit numbers from look-up tables 630 and 635, and the carry signal of the addition of X0 and Y0 through the carry chain from adder 640. Adder 645 may compute the sum of signals X0, Y0, X1, and Y1 and provide the result at an output of logic region 610. If desired, adder 645 may compute the carry signal resulting from the addition of X0, Y0, X1, and Y1 and route the carry signal to an output of logic region 610.

If desired, adders 680 and 685 in logic region 650 may be configured as an adder circuit that adds two-bit numbers "X3 X2" and "Y3 Y2" together and represents the result as a three-bit number. In this configuration, adder 680 may receive '0' at the carry input and the two least significant bits X2 and Y2 of the two two-bit numbers from look-up tables 660 and 665, respectively, and compute the sum and the carry signal for those signals. The sum of X2 and Y2 may be provided at an output of logic region 650.

Adder 685 may receive the two most significant bits X3 and Y3 of the two two-bit numbers from look-up tables 670 and 675, and the carry signal of the addition of X2 and Y2 through the carry chain from adder 680. Adder 685 may compute the sum of signals X2, Y2, X3, and Y3 and provide the result at an output of logic region 650. If desired, adder 685 may compute the carry signal resulting from the addition of X2, Y2, X3, and Y3 and route the carry signal to an output of logic region 650.

Consider the scenario in which logic regions 610 and 650 are configured to implement an adder circuit that adds two four-bit numbers (e.g., "X3 X2 X1 X0" and "Y3 Y2 Y1 Y0") together and in which the result may be represented as a five-bit number. In this scenario, adder 640 may receive the two least significant bits X0 and Y0 of the two four-bit numbers from look-up tables 620 and 625, respectively, and compute the sum and the carry signal for those two input signals. The sum of X0 and Y0 may be provided as the first result bit at an output of logic region 610.

Adder 645 may receive bits X1 and Y1 of the two four-bit numbers from look-up tables 630 and 635 and the carry signal of the addition of X0 and Y0 through the carry chain from adder 640. Adder 645 may compute the second result bit based on signals X0, Y0, X1, and Y1 and provide the second result bit at an output of logic region 610. Adder 645 may compute the carry signal resulting from the addition of X0, Y0, X1, and Y1 and route the carry signal to adder 680 in logic region 650.

Adder 680 may receive bits X2 and Y2 of the two four-bit numbers from look-up tables 660 and 665 and the carry signal of the addition of X0, Y0, X1, and Y1 through the carry chain from adder 645. Adder 680 may compute the third result bit based on signals X0, Y0, X1, Y1, X2, and Y2 and provide the third result bit at an output of logic region 650. Adder 680 may compute the carry signal resulting from the addition of X0, Y0, X1, Y1, X2, and Y2 and route the carry signal to adder 685.

Adder 685 may receive the two most significant bits X3 and Y3 of the two four-bit numbers from look-up tables 670 and 675, and the carry signal of the addition of X0, Y0, X1, Y1, X2, and Y2 through the carry chain from adder 680. Adder 685 may compute the fourth result bit based on signals X0, Y0, X1, Y1, X2, Y2, X3, and Y3 and provide the fourth result bit at an output of logic region 650. If desired, adder 685 may compute the carry signal resulting from the addition of X0, Y0, X1, Y1, X2, Y2, X3, and Y3 as the fifth result bit and route the carry signal to an output of logic region 650.

In another example, adders 640 and 645 in logic region 610 and adders 680 and 685 in logic region 650 may be configured as two independent majority voting circuits in two quad-mode redundancy configurations. In this configuration, look-up tables 620, 625, 630, and 635 may implement the same first function and receive the same first set of input signals, and look-up tables 660, 665, 670, and 675 may implement the same second function and receive the same second set of input signals.

Adder 640 may receive signals X0 and Y0 from look-up tables 620 and 625, respectively, and compute the carry signal for those two signals. Adder 645 may receive signal X1 from look-up table 630, signal Y1 from look-up table 635, and the carry signal of X0 and Y0 through the carry chain from adder 640. Adder 645 may compute the majority signal of X0, Y0, X1, and Y1, which may be routed to an output of logic region 610.

Adder 680 may receive signals X2 and Y2 from look-up tables 660 and 665, respectively, and compute the carry signal for those two signals. Adder 685 may receive signal X3 from look-up table 670, signal Y3 from look-up table 675, and the carry signal of X2 and Y2 through the carry chain from adder 680. Adder 685 may compute the majority signal of X2, Y2, X3, and Y3, which may be routed to an output of logic region 650.

Figure 7:
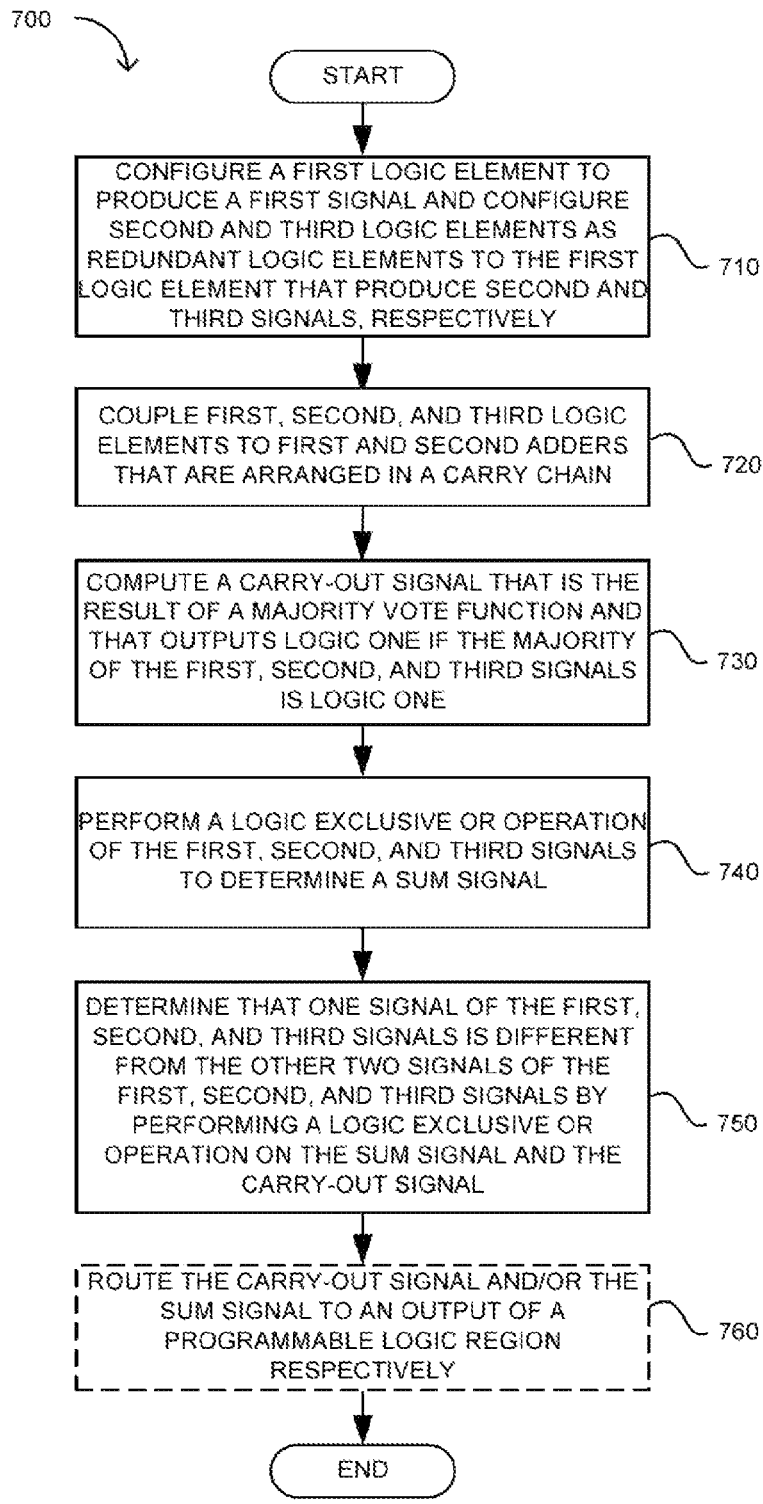
FIG. 7 is a flow chart showing illustrative steps for implementing multi-mode redundancy on a programmable integrated circuit in accordance with an embodiment.

FIG. 7 is a flow chart showing illustrative steps for implementing multi-mode redundancy on a programmable integrated circuit. During step 710, a first logic element (e.g., look-up table 425 of FIG. 4) may be configured to produce a first signal, and second and third logic elements (e.g., look-up tables 430 and 435, respectively) may be configured as redundant logic elements of the first logic element. The second and third logic elements may produce second and third signals, respectively.

During step 720, the first, second, and third logic elements may be coupled to first and second adders (e.g., adders 440 and 445 of FIG. 4) that are arranged in a carry chain. During step 730, first and second adders may compute a carry-out signal that is the result of a majority vote function and outputs logic one if the majority of the first, second and third signals is logic one. During step 740, first and second adders may perform a logic exclusive OR operation of the first, second, and third signals to determine a sum signal.

Sum and carry-out signals may be used during step 750 to determine that one signal of the first, second, and third signals is different from the other two signals of the first, second, and third signals. For this purpose, a logic exclusive OR gate may perform a logic exclusive OR operation on the sum signal and the carry-out signal.

If desired, the carry-out signal and/or the sum signal may be routed to an output of a programmable logic region, respectively.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using multi-mode redundancy is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
a first logic circuit;
a second logic circuit; and
an adder circuit that receives signals from both the first and second logic circuits in a first mode and that receives signals from only the second logic circuit in a second mode that is different than the first mode, wherein the second mode implements a majority voting function.

2. The integrated circuit of claim 1, further comprising:
a first additional adder circuit that is coupled to adder circuit.

3. The integrated circuit of claim 2, further comprising:
a second additional adder circuit that is connected to the adder circuit and the first additional adder circuit in a chain.

4. The integrated circuit of claim 1, wherein the first and second logic circuits are functionally equivalent.

5. The integrated circuit of claim 1, wherein the first and second logic circuits comprise lookup table circuits.

6. The integrated circuit of claim 1, wherein the first and second logic circuits each have at least three inputs.

7. The integrated circuit of claim 1, further comprising:
a third logic circuit;
a fourth logic circuit; and
an additional adder circuit that receives signals from both the third logic circuit and the fourth logic circuit in the first and second modes.

8. The integrated circuit of claim 7, wherein the additional adder circuit receives signals from the adder circuit.

9. The integrated circuit of claim 8, wherein the second, third, and fourth logic circuits are functionally equivalent.

10. The integrated circuit of claim 8, further comprising:
a fifth logic circuit; and
another adder circuit that receives signals from only the fifth logic circuit and the additional adder circuit in the second mode.

11. An integrated circuit, comprising:
a first adder circuit; and
a second adder circuit connected to the first adder circuit in a chain, wherein the first and second adder circuits are configured as a multi-input summation circuit in a first mode and are further configured as a majority voting circuit in a second mode that is different than the first mode.

12. The integrated circuit of claim 11, further comprising:
first and second logic circuits operable to output signals to the first adder circuit; and
third and fourth logic circuits operable to output signals to the second adder circuit.

13. The integrated circuit of claim 12, wherein the first adder circuit receives signals from both the first and second logic circuits in the first mode, and wherein the first adder circuit receives signals from the second logic circuit but not the first logic circuit in the second mode.

14. The integrated circuit of claim 12, wherein the second, third, and fourth logic circuits receive the same input signals and generate output signals that are different than the input signals.

15. The integrated circuit of claim 12, wherein the first, second, third, and fourth logic circuits do not receive clock signals.

16. An integrated circuit, comprising:
a first logic circuit that outputs a first signal;
a second logic circuit that outputs a second signal;
a third logic circuit that outputs a third signal;
an adder circuit that receives signals the first, second, and third signals and that outputs a sum signal and a majority signal; and
a logic gate that receives the sum signal and the majority signal from the adder circuit and that outputs a corresponding error signal.

17. The integrated circuit of claim 16, wherein the logic gate comprises a logic exclusive-OR gate.

18. The integrated circuit of claim 16, wherein the first, second, and third logic circuits comprise lookup table circuits.

19. The integrated circuit of claim 16, wherein the first, second, and third logic circuits receive the same input signals, and wherein the first signal generated by the first logic circuit is different than the received input signal.

20. The integrated circuit of claim 16, wherein the first, second, and third logic circuits are functionally equivalent.

* * * * *